US009311728B2

(12) United States Patent
Castelli et al.

(10) Patent No.: US 9,311,728 B2
(45) Date of Patent: Apr. 12, 2016

(54) METHODS FOR CREATING DYNAMIC LISTS FROM SELECTED AREAS OF A POWER SYSTEM OF A UTILITY COMPANY

(71) Applicant: ALSTOM TECHNOLOGY LTD., Baden (CH)

(72) Inventors: Gennaro Castelli, Bothell, WA (US); Michael Hackett, Kirkland, WA (US); Michael Quinn Howard, Bothell, WA (US); Lawrence Edmund Jones, Washington, DC (US); HuiChu Su Shung, Bellevue, WA (US); Heath Daniel Brand, Sammamish, WA (US)

(73) Assignee: ALSTOM TECHNOLOGY LTD., Baden (CH)

( * ) Notice: Subject to any disclaimer, the term of this patent is extended or adjusted under 35 U.S.C. 154(b) by 764 days.

(21) Appl. No.: 13/658,489

(22) Filed: Oct. 23, 2012

(65) Prior Publication Data

US 2013/0057579 A1    Mar. 7, 2013

Related U.S. Application Data

(63) Continuation of application No. 12/139,167, filed on Jun. 13, 2008, now Pat. No. 8,321,800.

(60) Provisional application No. 60/952,021, filed on Jul. 26, 2007.

(51) Int. Cl.
*G06F 3/14* (2006.01)
*G06T 11/20* (2006.01)
*G06Q 10/06* (2012.01)
*H02J 3/00* (2006.01)

(Continued)

(52) U.S. Cl.
CPC ............ *G06T 11/206* (2013.01); *G06Q 10/063* (2013.01); *G06Q 10/06315* (2013.01); *G06T 3/40* (2013.01); *G06T 11/60* (2013.01); *G08B 23/00* (2013.01); *H02J 3/00* (2013.01); *H04L 43/045* (2013.01); *H02J 2003/007* (2013.01); *Y02E 60/76* (2013.01); *Y04S 40/22* (2013.01)

(58) Field of Classification Search
CPC ..................................... G06F 3/14; G06F 3/17
USPC ........... 715/764; 700/291; 701/208; 315/344; 363/170
See application file for complete search history.

(56) References Cited

U.S. PATENT DOCUMENTS

| 4,078,260 A | 3/1978 | Chen et al. ..................... 707/611 |
| 4,455,614 A | 6/1984 | Martz et al. ................... 700/288 |

(Continued)

OTHER PUBLICATIONS

Extended European Search Report mailed Oct. 2, 2013 for European Patent Application 08782090.8-1806, 6 pages.

(Continued)

*Primary Examiner* — Ruay Ho
(74) *Attorney, Agent, or Firm* — Amin, Turocy & Watson, LLP

(57) ABSTRACT

Methods are provided for creating dynamic lists from selected areas of a power system of a utility company. The utility company has an energy management system with a control panel. The energy management system is used to access one or more source displays of a site. Rubber-banding or lassoing is used to create selected areas from at least a portion of the source displays. Lists are dynamically created. Operator defined information is displayed for each element type in a list of network elements from the selected areas that have been rubber-banded or lassoed.

20 Claims, 18 Drawing Sheets

(51) Int. Cl.
  *G06T 3/40* (2006.01)
  *G06T 11/60* (2006.01)
  *G08B 23/00* (2006.01)
  *H04L 12/26* (2006.01)

(56) References Cited

U.S. PATENT DOCUMENTS

| | | | |
|---|---|---|---|
| 4,804,938 A | 2/1989 | Rouse et al. | 370/276 |
| 5,136,497 A | 8/1992 | Coe et al. | 700/45 |
| 5,185,886 A | 2/1993 | Edem et al. | 707/611 |
| 5,384,697 A | 1/1995 | Pascucci | 700/10 |
| 5,414,640 A | 5/1995 | Seem | 700/291 |
| 5,568,019 A * | 10/1996 | Mason | 315/344 |
| 5,594,659 A | 1/1997 | Schlueter | 700/286 |
| 5,598,566 A | 1/1997 | Pascucci et al. | 713/324 |
| 5,655,136 A | 8/1997 | Morgan | 382/187 |
| 5,729,731 A | 3/1998 | Yajima et al. | |
| 5,904,727 A | 5/1999 | Prabhakaran | 701/454 |
| 5,933,355 A | 8/1999 | Deb | 702/60 |
| 5,937,414 A | 8/1999 | Souder et al. | 707/616 |
| 5,963,457 A | 10/1999 | Kanoi et al. | 700/291 |
| 6,021,402 A | 2/2000 | Takriti | 705/412 |
| 6,178,362 B1 | 1/2001 | Woolard et al. | 700/295 |
| 6,259,972 B1 | 7/2001 | Sumic et al. | 700/292 |
| 6,289,267 B1 | 9/2001 | Alexander et al. | 700/286 |
| 6,313,752 B1 | 11/2001 | Corrigan et al. | 340/657 |
| 6,353,847 B1 | 3/2002 | Maruyama et al. | 718/105 |
| 6,528,957 B1 | 3/2003 | Luchaco | 315/307 |
| 6,549,880 B1 | 4/2003 | Willoughby et al. | 703/13 |
| 6,577,962 B1 | 6/2003 | Afshari | 702/61 |
| 6,591,255 B1 | 7/2003 | Tatum et al. | 706/25 |
| 6,620,327 B2 | 9/2003 | Haddock | 210/652 |
| 6,681,154 B2 | 1/2004 | Nierlich et al. | 700/286 |
| 6,681,156 B1 | 1/2004 | Weiss | 700/291 |
| 6,741,485 B1 * | 5/2004 | Runkle et al. | 363/170 |
| 6,813,525 B2 | 11/2004 | Reid et al. | 700/19 |
| 6,885,915 B2 | 4/2005 | Rehtanz et al. | 700/291 |
| 6,901,347 B1 | 5/2005 | Murray et al. | 702/182 |
| 6,925,385 B2 | 8/2005 | Ghosh et al. | 702/14 |
| 6,961,641 B1 | 11/2005 | Forth et al. | 700/295 |
| 6,965,454 B1 | 11/2005 | Silverbrook et al. | 358/1.9 |
| 7,058,522 B2 | 6/2006 | Chen | 702/60 |
| 7,177,727 B2 | 2/2007 | Chu et al. | 700/287 |
| 7,177,728 B2 | 2/2007 | Gardner | 700/295 |
| 7,194,338 B2 | 3/2007 | Schlueter et al. | 700/286 |
| 7,233,843 B2 | 6/2007 | Budhraja et al. | 700/291 |
| 7,283,930 B2 | 10/2007 | Flynn | 702/182 |
| 7,305,282 B2 | 12/2007 | Chen | 700/297 |
| 7,343,226 B2 | 3/2008 | Ehlers et al. | 700/276 |
| 7,454,717 B2 | 11/2008 | Hinckley et al. | 715/863 |
| 7,519,438 B2 | 4/2009 | Barbour et al. | 700/22 |
| 7,558,703 B2 | 7/2009 | Stoupis et al. | 702/183 |
| 7,626,497 B2 | 12/2009 | Mollenkopf | |
| 7,689,394 B2 | 3/2010 | Furem et al. | 703/8 |
| 7,774,307 B2 | 8/2010 | Ju et al. | 707/616 |
| 7,831,569 B2 | 11/2010 | Bestgen et al. | 707/676 |
| 7,873,442 B2 | 1/2011 | Tsui | 700/291 |
| 8,222,765 B2 | 7/2012 | Collins et al. | 307/44 |
| 8,280,799 B2 | 10/2012 | Bing | 705/37 |
| 2001/0045418 A1 | 11/2001 | Chithambaram et al. | 345/418 |
| 2002/0029097 A1 | 3/2002 | Pionzio, Jr. et al. | 700/287 |
| 2002/0032535 A1 | 3/2002 | Alexander et al. | 702/64 |
| 2002/0042789 A1 | 4/2002 | Michalewicz et al. | 707/3 |
| 2002/0085326 A1 | 7/2002 | Kim et al. | 361/42 |
| 2002/0198629 A1 | 12/2002 | Ellis | 700/286 |
| 2003/0115306 A1 | 6/2003 | Hagarty et al. | |
| 2003/0158631 A1 | 8/2003 | Masuda et al. | 700/286 |
| 2003/0171851 A1 | 9/2003 | Brickfield et al. | 700/286 |
| 2004/0093124 A1 | 5/2004 | Havlena | 700/291 |
| 2004/0117330 A1 | 6/2004 | Ehlers et al. | 705/412 |
| 2004/0139038 A1 | 7/2004 | Ehlers et al. | 705/412 |
| 2004/0158360 A1 | 8/2004 | Garland et al. | 700/286 |
| 2004/0220702 A1 | 11/2004 | Matsubara et al. | 700/291 |
| 2004/0225648 A1 | 11/2004 | Ransom et al. | |
| 2004/0225649 A1 | 11/2004 | Yeo et al. | 707/3 |
| 2004/0249775 A1 | 12/2004 | Chen | 706/21 |
| 2004/0260430 A1 | 12/2004 | Mansingh et al. | 700/286 |
| 2004/0260489 A1 | 12/2004 | Mansingh et al. | 702/60 |
| 2005/0033481 A1 | 2/2005 | Budhraja et al. | 700/286 |
| 2005/0039787 A1 | 2/2005 | Bing | 136/243 |
| 2005/0055330 A1 | 3/2005 | Britton et al. | 707/1 |
| 2005/0071124 A1 | 3/2005 | Komatsu | 702/182 |
| 2005/0169743 A1 | 8/2005 | Hicks | 415/90 |
| 2005/0197742 A1 | 9/2005 | Scott et al. | 700/286 |
| 2005/0234600 A1 | 10/2005 | Boucher et al. | 700/286 |
| 2005/0240381 A1 | 10/2005 | Seiler et al. | 703/1 |
| 2005/0240539 A1 | 10/2005 | Olavson | 705/400 |
| 2006/0005738 A1 | 1/2006 | Kumar | 105/35 |
| 2006/0072828 A1 | 4/2006 | Silverbrook et al. | 382/203 |
| 2006/0156248 A1 | 7/2006 | Chaudhri et al. | 715/779 |
| 2006/0167591 A1 | 7/2006 | McNally | 700/291 |
| 2006/0174209 A1 | 8/2006 | Barros | 715/764 |
| 2006/0200308 A1 * | 9/2006 | Arutunian | 701/208 |
| 2006/0206240 A1 | 9/2006 | Tsui | 700/291 |
| 2006/0238364 A1 | 10/2006 | Keefe | |
| 2006/0259199 A1 | 11/2006 | Gjerde et al. | 700/284 |
| 2007/0083821 A1 | 4/2007 | Garbow et al. | 715/781 |
| 2007/0143046 A1 | 6/2007 | Budike, Jr. | 702/62 |
| 2007/0156291 A1 | 7/2007 | Curt et al. | 700/286 |
| 2007/0213956 A1 | 9/2007 | Nasle et al. | 702/182 |
| 2007/0236507 A1 | 10/2007 | Tigges | 345/592 |
| 2007/0244604 A1 | 10/2007 | McNally | 700/291 |
| 2007/0276547 A1 | 11/2007 | Miller | 700/295 |
| 2007/0285079 A1 | 12/2007 | Nasle | 324/76.22 |
| 2008/0077368 A1 | 3/2008 | Nasle | 703/4 |
| 2008/0167756 A1 | 7/2008 | Golden et al. | 700/291 |
| 2008/0174564 A1 | 7/2008 | Kim et al. | 345/173 |
| 2008/0189656 A1 | 8/2008 | Abanami et al. | 715/810 |
| 2008/0263469 A1 | 10/2008 | Nasle et al. | 715/771 |
| 2008/0300698 A1 | 12/2008 | Havekost et al. | |
| 2008/0301565 A1 | 12/2008 | Abhyanker | 715/744 |
| 2009/0062969 A1 | 3/2009 | Chandra et al. | 700/291 |
| 2009/0073191 A1 | 3/2009 | Smith et al. | 345/629 |
| 2009/0093916 A1 | 4/2009 | Parsonnet et al. | 700/286 |
| 2009/0234511 A1 | 9/2009 | Ouchi et al. | 700/291 |
| 2010/0076835 A1 | 3/2010 | Silverman | 705/14.33 |
| 2010/0100250 A1 * | 4/2010 | Budhraja et al. | 700/291 |
| 2010/0179704 A1 | 7/2010 | Ozog | 700/291 |
| 2010/0222935 A1 | 9/2010 | Forbes et al. | 700/291 |
| 2010/0274402 A1 | 10/2010 | Shaffer | 700/291 |
| 2010/0281405 A1 | 11/2010 | Whattam | |
| 2010/0292856 A1 | 11/2010 | Fujita | 700/291 |
| 2011/0029141 A1 | 2/2011 | Sun et al. | 700/291 |
| 2011/0029142 A1 | 2/2011 | Sun et al. | 700/291 |
| 2011/0029147 A1 | 2/2011 | Sun et al. | 700/295 |
| 2011/0035071 A1 | 2/2011 | Sun et al. | 700/291 |
| 2011/0071690 A1 | 3/2011 | Sun et al. | 700/286 |
| 2011/0173109 A1 | 7/2011 | Synesiou et al. | 705/34 |
| 2011/0184604 A1 | 7/2011 | Franke et al. | |
| 2011/0202467 A1 | 8/2011 | Hilber et al. | 705/80 |
| 2011/0231028 A1 | 9/2011 | Ozog | 700/291 |
| 2011/0282508 A1 | 11/2011 | Goutard et al. | 700/293 |
| 2012/0136775 A1 | 5/2012 | Cotton | |

OTHER PUBLICATIONS

Examination Report dated Sep. 26, 2013 for Europen Patent Application No. 08 782 095.7-1806, 3 pages.

Tomsovic, K., Bakken, D., Venkatasubramanian, M. and Bose, A.—Designing the Next Generation of Real-Time Control, Communication and Computations for Large Power Systems, Proceedings of the IEEE (Special Issue on Energy Infrastructure Systems), 93(5), May 2005.

Overbye, T. J., Meliopoulos, A.P., Wiegmann, D.A., & Cokkinides, G.J. (2005) Visualization of Power Systems and Components: Final Report. University of Illinois at Urbana-Champaign. Power Systems Engineering Research Center (PSERC) Publication 05-065.

Ray Klump, David Schooley, et al. "An advanced visualization platform for real-time power systems operations". Power Systems Computation Conference (PSCC), Sevilla, Spain, Jun. 2002, 8 pages.

Pahalawaththa, N.C. Arnold, C P. Shurety, M. "A power system CAD package for the workstation and personal computer environment." IEEE Transactions on Power Systems. vol. 6, No. 1, pp. 400-406. Feb. 1991.

(56) References Cited

OTHER PUBLICATIONS

CERTS Real-time Voltage Monitoring and VAR Management System, California Energy Commission, Oct. 2003, P500-03-087F, 20 pages.
A. P. Sakis Meliopoulos, Power System Modeling, Analysis and Control, Georgia Institute of Technology, 2002.
Wu, F.F. Moslehi, K. Bose, A. Power System Control Centers; Past, Present, and Future. Proceedings IEEE, 2005, vol. 93; No. 11, pp. 1890-1908.
Office Action dated Mar. 13, 2015 for U.S. Appl. No. 13/590,321, 51 pages.
European Office Action dated Jun. 11, 2014 for European Application Serial No. 08796334.4, 3 pages.
European Office Action dated Jun. 6, 2014 for European Application Serial No. 08782090.8, 4 pages.
European Office Action dated Jul. 8, 2014 for European Application Serial No. 08782097.3, 4 pages.
Office Action dated Jul. 17, 2013 for U.S. Appl. No. 12/139,159, 28 pages.
International Search Report mailed on Oct. 9, 2008 for International Patent Application No. PCT/US08/70526, 3 pages.
International Search Report mailed on Oct. 9, 2008 for International Patent Application No. PCT/US08/70537, 3 pages.
International Search Report mailed on Oct. 8, 2008 for International Patent Application No. PCT/US08/70544, 3 pages.
International Search Report mailed on Oct. 9, 2008 for International Patent Application No. PCT/US08/70547, 3 pages.
International Search Report mailed on Oct. 10, 2008 for International Patent Application No. PCT/US08/70551, 3 pages.
International Search Report mailed on Oct. 10, 2008 for International Patent Application No. PCT/US08/70552, 3 pages.
Examination Report dated May 2, 2013 for European Patent Application No. 08796334.4-1806, 3 pages.
Examination Report dated May 2, 2013 for European Patent Application No. 08782095.7-1806, 3 pages.
Examination Report dated Mar. 15, 2013 for European Patent Application No. 08796327.8-1806, 3 pages.
Examination Report dated May 2, 2013 for European Patent Application No. 08782097.3-1806, 3 pages.
Examination Report dated May 2, 2013 for European Patent Application No. 08796333.6-1806, 62 pages.
European Office Action dated Aug. 9, 2015 for European Application Serial No. 08782095.7, 4 pages.
European Office Action dated Aug. 24, 2015 for European Application Serial No. 08782097.3, 4 pages.
European Office Action dated Aug. 21, 2015 for European Application Serial No. 08796334.4, 3 pages.
Final Office Action dated Oct. 15, 2015 for U.S. Appl. No. 13/590,321, 31 pages.

* cited by examiner

METHODS FOR CREATING DYNAMIC LISTS FROM SELECTED AREAS OF A POWER SYSTEM OF A UTILITY COMPANY

CROSS-REFERENCE TO RELATED APPLICATIONS

This application is a continuation of U.S. Ser. No. 12/139,167 filed Jun. 13, 2008, which claims the benefit of U.S. Ser. No. 60/952,021 filed Jul. 26, 2007, which application is fully incorporated herein by reference.

FIELD OF THE INVENTION

This invention relates generally systems and methods that improve energy management, and more particularly to systems and methods for the utility market.

DESCRIPTION OF THE RELATED ART

The modern electric power grid begins as the primary circuit leaves the generating sub-station, is transported via transmission line, distributed via distribution feeders, and ends as the secondary service enters the customers meter socket. This invention relates to the management of the transmission system, from a control center, which purpose is to maintain all equipment within operating limits and to ensure the provision of electricity at a reliability rate greater than 99.999%.

To manage the grid, electric utilities rely on Energy Management Systems (EMS) which are mission critical information system that collect data from the field and can control protection devices from the control center via a Supervisory Control and Data Acquisition system (SCADA).

The EMS are more sophisticated today with advanced algorithms and increasing volume of data coming from smarter grids that are equipped with intelligent electronic devices (IED).

However, intelligent grids and sophisticate power system algorithms that process field data will not suffice to prevent human errors in control centers. Operators continuously train to adapt to new system conditions and react to emergency situations. This general aptitude to master complex information and make correct decisions is referred to as "situation awareness".

Catastrophic failures of a power system are relatively uncommon, but they are spectacular when they happen. Twenty-five million people in the northeastern United States lost electric power for 12 hours in 1965. Another blackout shut down New York City for several days in 1977. And in 2003, the largest power failure in North American history left 40 million people in an area in the United States stretching from Massachusetts, Connecticut, New York and New Jersey west to Ohio and Michigan, and 10 million people in eastern Canada, without power. The lack of adequate situational awareness at multiple levels was one of the root causes of the Aug. 14, 2003 massive power blackout in North America.

Designing tools for adequate Situation Awareness (SA) includes that the following factors be kept in mind: so-called "enemies of situational awareness": attention tunneling, requisite memory trap; data overload; misplaced salience; complexity creep, errant mental models, out-of-the-loop syndrome; workload, anxiety, fatigue, and other stress factors.

There is a need for methods that create dynamic lists from selected areas of a power system of a utility company. There is a further need for methods that dynamically create lists and displaying operator defined information for each element type in a list of network elements from selected areas that have been rubber-banded or lassoed.

SUMMARY OF THE INVENTION

Accordingly, an object of the present invention is to provide methods of creating dynamic lists from selected areas of a power system of a utility company.

Another object of the present invention is to provide methods of dynamically creating lists and displaying operator defined information for each element type in a list of network elements from selected areas that have been rubber-banded or lassoed.

A further object of the present invention is to provide methods of dynamically creating lists that are saved and recalled for future use, and displaying operator defined information for each element type in a list of network elements.

Yet another object of the present invention is to provide methods of creating dynamic lists from selected areas of a power system of a utility company and using the lists of network elements to identify vital signs for the system.

Still another object of the present invention is to provide methods of creating dynamic lists from selected areas of a power system of a utility company and identifying network elements within the perimeter of the selected area.

These and other objects of the present invention are achieved in, a method of creating dynamic lists from selected areas of a power system of a utility company. The utility company has an energy management system with a control panel. The energy management system is used to access one or more source displays of a site. Rubber-banding or lassoing is used to create selected areas from at least a portion of the source displays. Lists are dynamically created. Operator defined information is displayed for each element type in a list of network elements from the selected areas that have been rubber-banded or lassoed.

DETAILED DESCRIPTION OF THE PREFERRED EMBODIMENT

Figure 13:
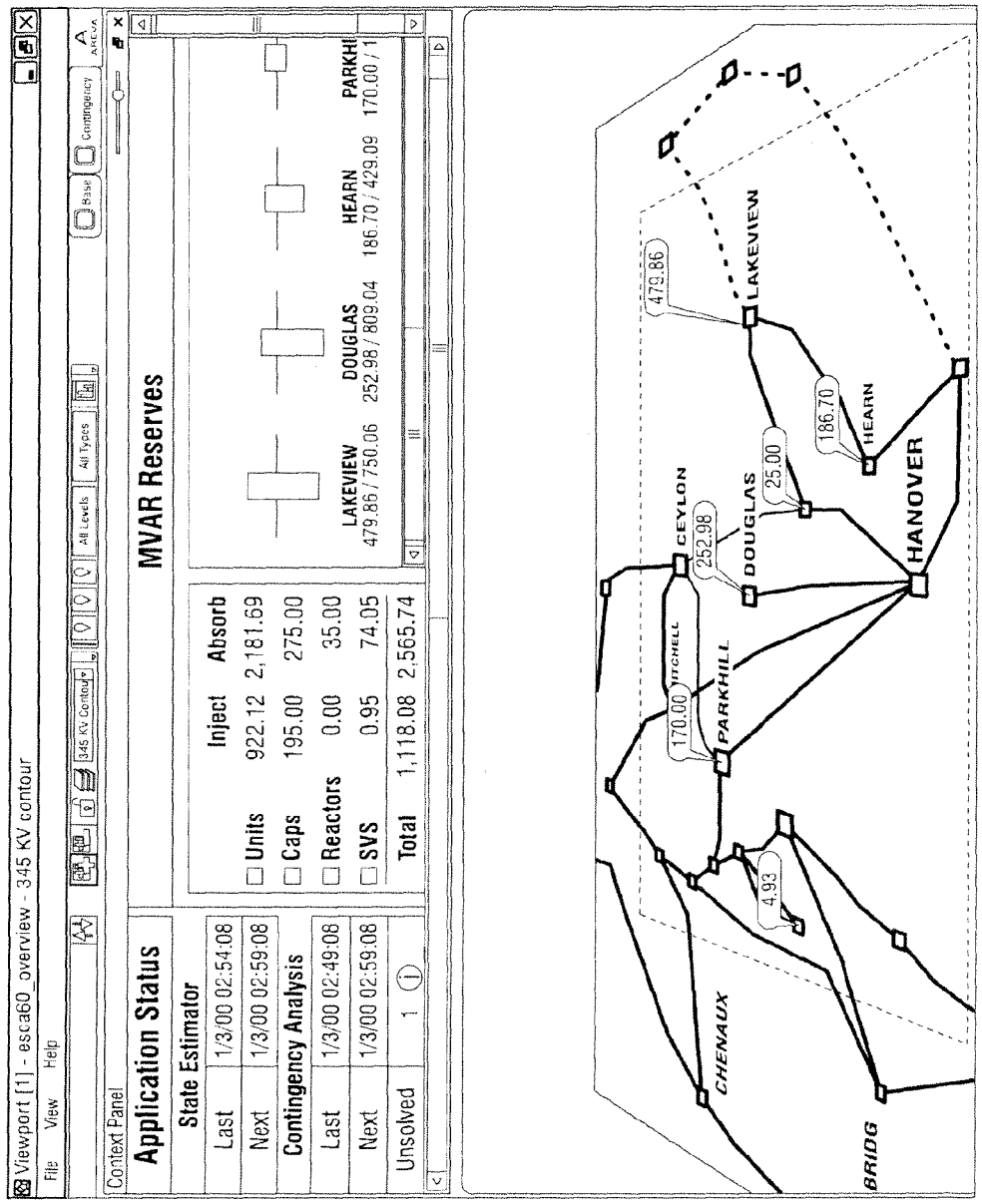
FIG. 13 illustrates a 3D view of the available MVARs using the positive and negative reactive reserves toolbar buttons, and can be associated with the FIG. 11 flow chart.

In various embodiments, the present invention provides a system and methods for enhance situational awareness for a control center of a utility company for improved energy management, to drill down on potential conditions that effect the distribution of power, and mitigates these potential conditions before catastrophic failures occur, provide a real time application of advanced graphics to display the current status of a power system of one or more utility companies, and the like. The present invention represents a new and improved way to design user interface, independently of the underlying application to display a 3D view of the available MVARs using the positive and negative reactive reserves toolbar buttons, as shown in FIG. 13.

The present invention represents a new and improved way to design user interface, independently of the underlying applications, algorithms, or databases. The main display is therefore targeted at a specific operator's task which may span several applications. Traditionally, a operator had to navigate among different user interfaces to achieve the same objective, albeit with much less productivity and slower reaction time.

The present invention is designed for mission critical systems that deal with large volume of data refreshed in real-time every seconds. These information systems cannot fail and must be available at a minimum 99.95% of the time.

The present invention is also designed to re-use most of the existing software applications already in place within the control center. Low cost of maintenance is achieved with automatic generation of displays and re-use of existing assets (software and hardware).

The systems and methods of the present invention can be used by utility companies that have a system including but not limited to power systems. The present invention can also be used by water management systems, petro-chemical systems, transportations systems, and the like. The power system is managed to bring energy to an end user and includes generation, transmission and distribution system. With the present invention, satellite maps can be utilized.

Figure 1:
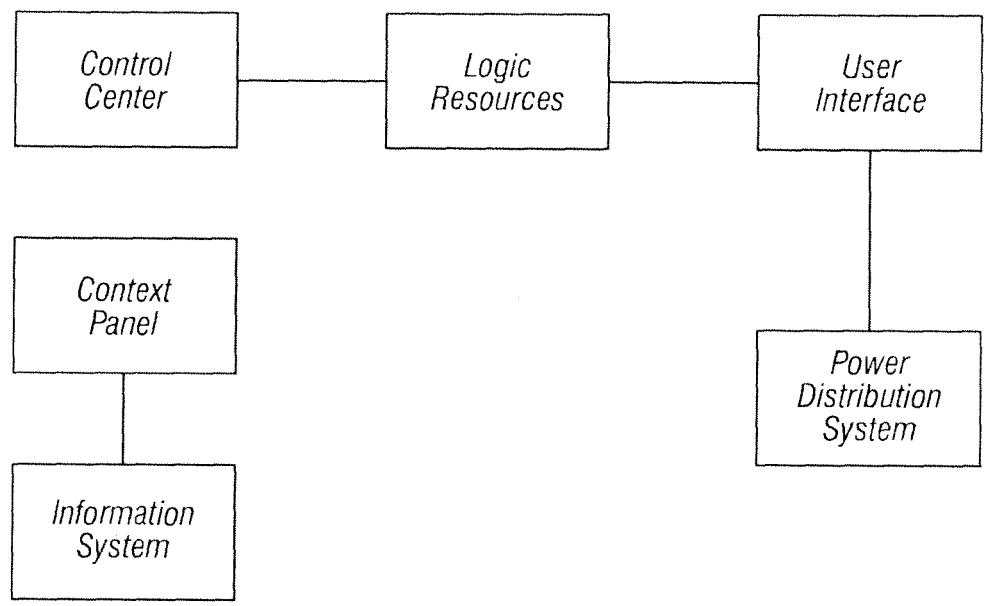
FIG. 1 is a block diagram illustrating one embodiment of an energy management system of the present invention that provides real time awareness of a potential energy management failure.

As illustrated in FIG. 1, one embodiment of the present invention has an energy management system that includes: a control center at a utility company; logic resources coupled to the power system that provide a real time notice of conditions which effect energy management of the utility company; and at least one user interface at the control center coupled to the logic resources. The user interfaces provide real time situation awareness of a potential energy management failure. The conditions can be one or more of energy, distribution, generation, transmission and energy market systems.

With the use of situation awareness of the present invention, a real time notice of conditions can be provided prior to an occurrence of, a catastrophic failure of power delivery, catastrophic power generation, catastrophic transmission and energy market systems and the like.

Situation awareness is perception and/or comprehension and is auditory and/or visual. Situational awareness, (i) improves energy management, facilitates drilling down on conditions that can effect energy management, (ii) facilitates distribution of power, generation of power, transmission and energy market systems, (iii) mitigates the effects of conditions that can create failures in energy management and (iv) mitigates conditions that can create failures including but not limited to, delivery of power, generation of power, transmission and energy market systems.

The logic resources and the user interface are coupled to the power or distribution system of the utility company. The logic resources uses an overview of the majority of the utility system and drills down to more detailed views of the utility system.

The logic resources can be configured to re-use at least a portion of data and configurations from pre-existing software applications already in place in the control center. As a non-limiting example, the pre-existing software applications can include information of, system 1 lines, 1 line diagrams and/or asset information. The user interfaces provide a specific operator's task that can scan one or several utility company applications without navigating between different user interfaces of the control center.

The user interfaces include graphics that display one or more of, current status, mitigating factors and recommendations of the power system for one or more utility companies. The user interfaces can include advanced graphics that display a current status of power generation, power generation, transmission and/or energy market systems. The user interfaces can be independent of an energy management application. In one embodiment, the user interfaces are automatically generated in response to data and configuration from pre-existing software or pre-existing software applications and also uses its own. The user interfaces can be a model driven overview, where the model driven overview combines coordinate system based on a geographical coordinate system including but not limited to GIS and the like.

One or more context panels can be provided with context data relative to a given situation facing the utility company. One or more information systems can also be provided that are refreshed in real-time. By way of non-limiting examples, the information system can be refreshed in a time period of from 1 second to 15 minutes, depending on the information and the situation.

Figure 2:
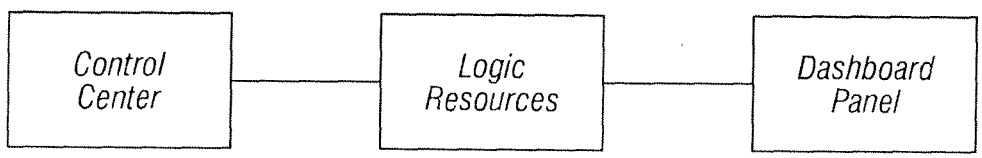
FIG. 2 is a block diagram illustrating one embodiment of an energy management system of the present invention which has situational dashboard panels.
Figure 3:
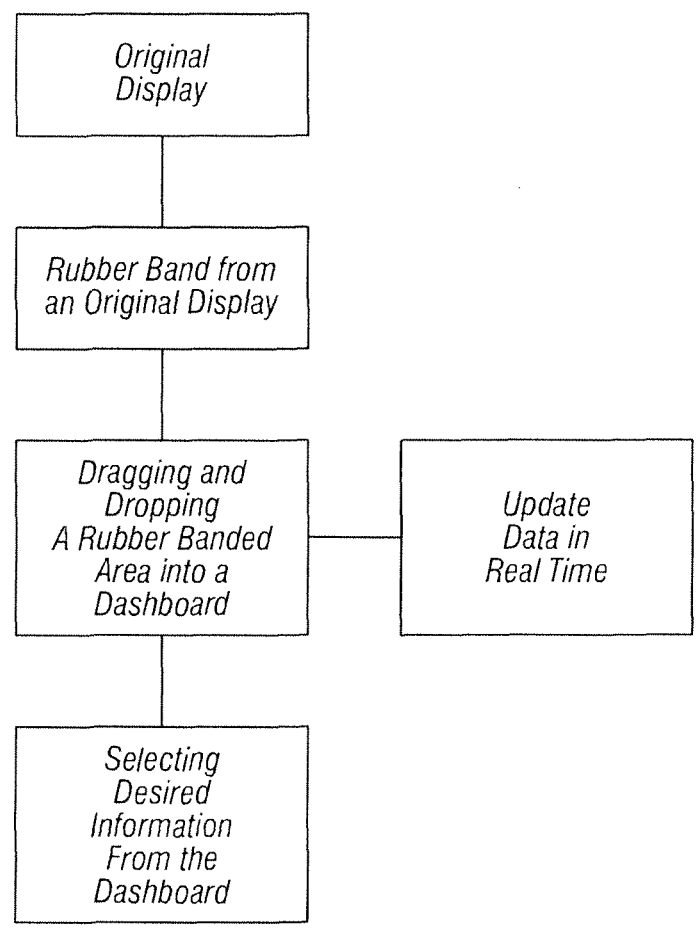
FIG. 3 is a flow chart illustrating one application of the FIG. 2 system.

In another embodiment of the present invention, illustrated in FIGS. 2 and 3, situational dynamic dashboards are created graphically and dynamically by operators. The situational dashboards can be built on-the-fly by combining subsets of, different displays, tabulars, one-lines, regional schematic and/or geographic overviews. The logic resources enable the operators to create their own dashboards from large geographical overviews, regional schematic displays and station one-line displays to assist operators in assessing a potentially compromising situation of the electric power system. Portions of the displays that are dropped onto a situational dashboard display can continue to be updated in real-time with live data.

As a non-limiting example, the potentially compromising situation can be, system violations of type branch, low voltage, high voltage and/or delta voltage, low or high voltage situation in a given area of the system, actual or potential system violations as a result of megawatts or megavars, and the like. The situational dashboards can be built on-the-fly by combining subsets of different displays, tabulars, one-lines, schematic, geographic overviews and the like, onto a dashboard area. The dashboards are saveable and reuseable, and are useful for identifying potentially compromising situations.

Figure 4:
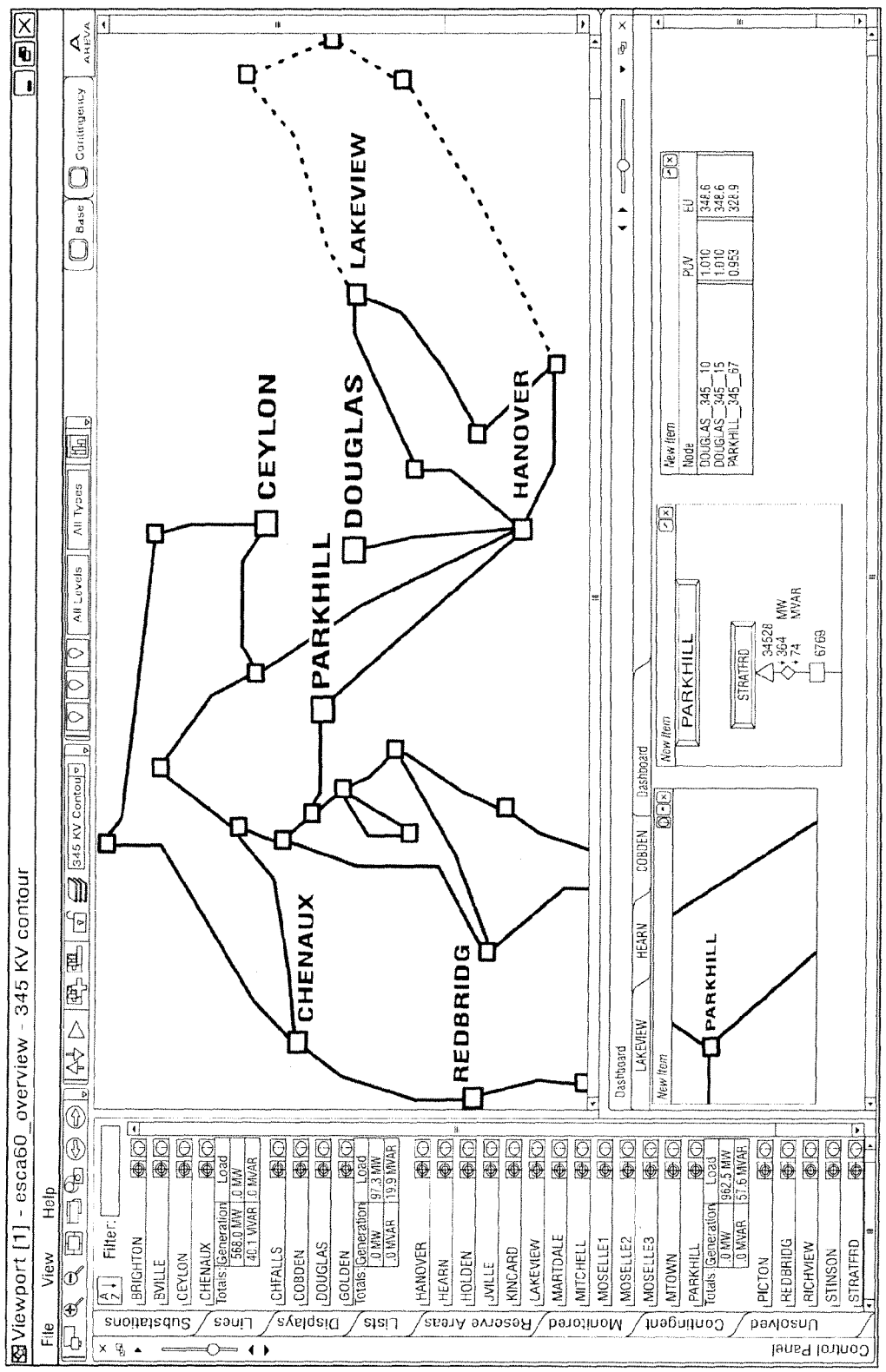
FIG. 4 illustrates one embodiment of a custom dashboard of the present invention sourced from three different displays.

FIG. 4 shows an example of a custom dashboard of the present invention sourced from three different displays. The operator selects the displays of interest. Snippets from the original displays are selected by rubber-banding, the selected area is cut (initiated by the operator "drag" operation) and then pasted, initiated by the operator "drop" operation, into the dashboard.

The portions of the displays that are dropped onto a dashboard display continue to be updated in real-time. The result is a new dashboard display. Once created, a dashboard can be saved and recalled later just as any other display in the system and is refreshed with live data. The benefits of a dynamically created dashboard, which is created to specifically address a situation, is that it allows the operator to select only the information that is relevant to the situation which the operator is facing. This reduces the workload on the operator since the operator needs to focus only on what is relevant not a collection of displays which have vast amount of information on it which may not be relevant. The concept is simple: provide the operator with only the information he needs to do the job, not all the data that the system has and letting the operator constantly review the data and extract what is needed. One the dynamic dashboards are created they can be saved and re-used should the situation present itself, thus eliminating setup time.

In one embodiment, a fly-out or data lensing is provided. A fly-out is an effective way to dynamically select an area of a large overview display of the power system, or any display for that matter to direct the operator attention to where or what in the power system needs attention without losing perspective of the whole power system which is being monitored and controlled.

The operator selects an area of the overview which it wishes to focus on by rubber-banding or lasso the area. The selected area of interest is cut and pasted into a fly-out. The fly-out can be moved and resized by dragging and resizing the fly-out border to enhance the usability of the fly-out.

Figure 5:
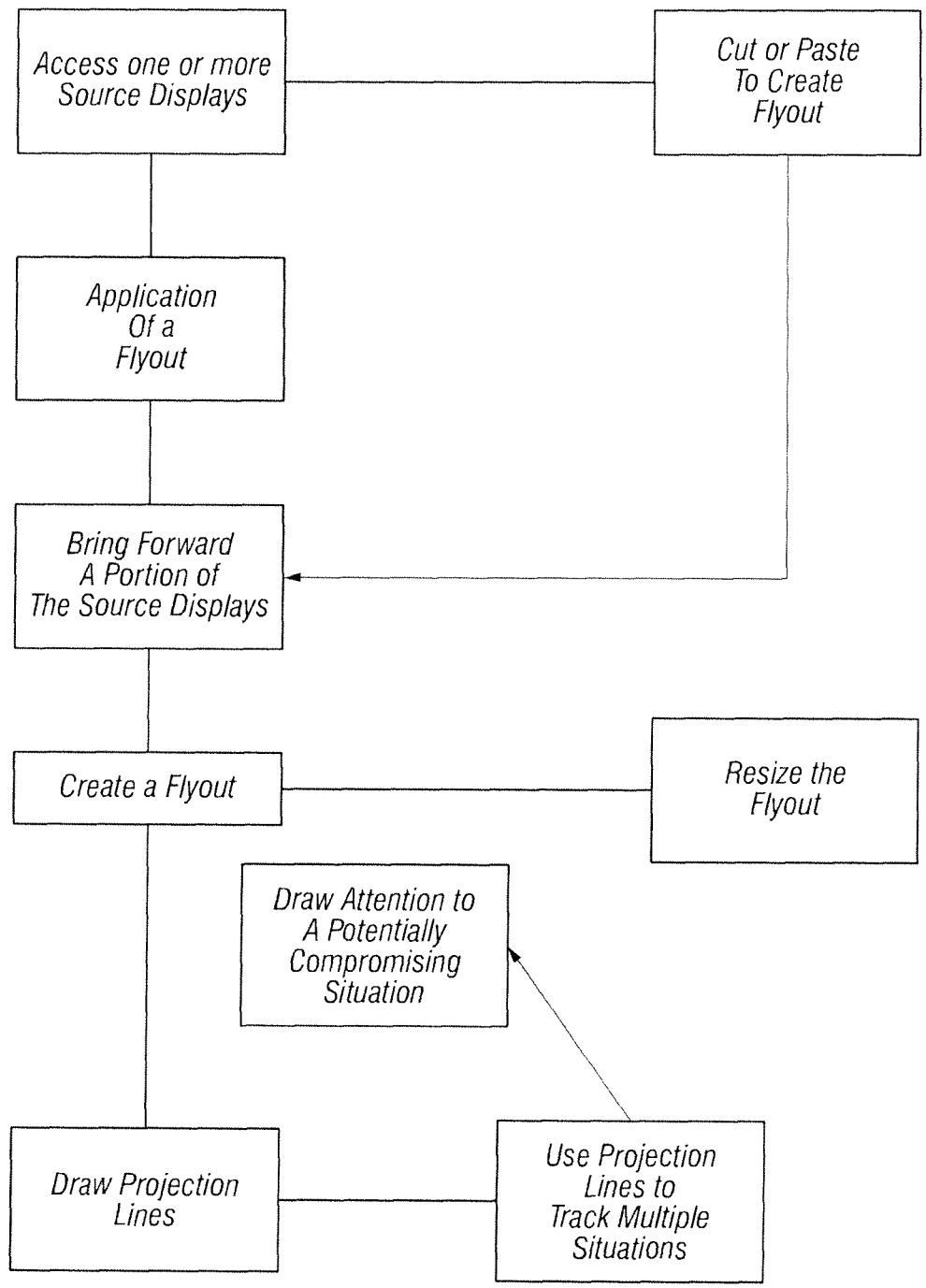
FIG. 5 is a flow chart illustrating one embodiment of a method of the present invention that assesses potentially compromising situations of a utility company.

As illustrated in FIG. 5, projection lines are can be drawn from the source display to the fly-out to maintain reference to the source such that the operator always knows about the reference source of the fly-out. The projection lines can be used with multiple fly-outs, and can track multiple situations at the same time. This is important because an operator may be tracking multiple situations at the same time and must be aware of the context of each of the situations from the multiple situations. The projection lines provide the operator with an awareness of a context of situations and information about a reference source of the fly-out.

Figure 6:
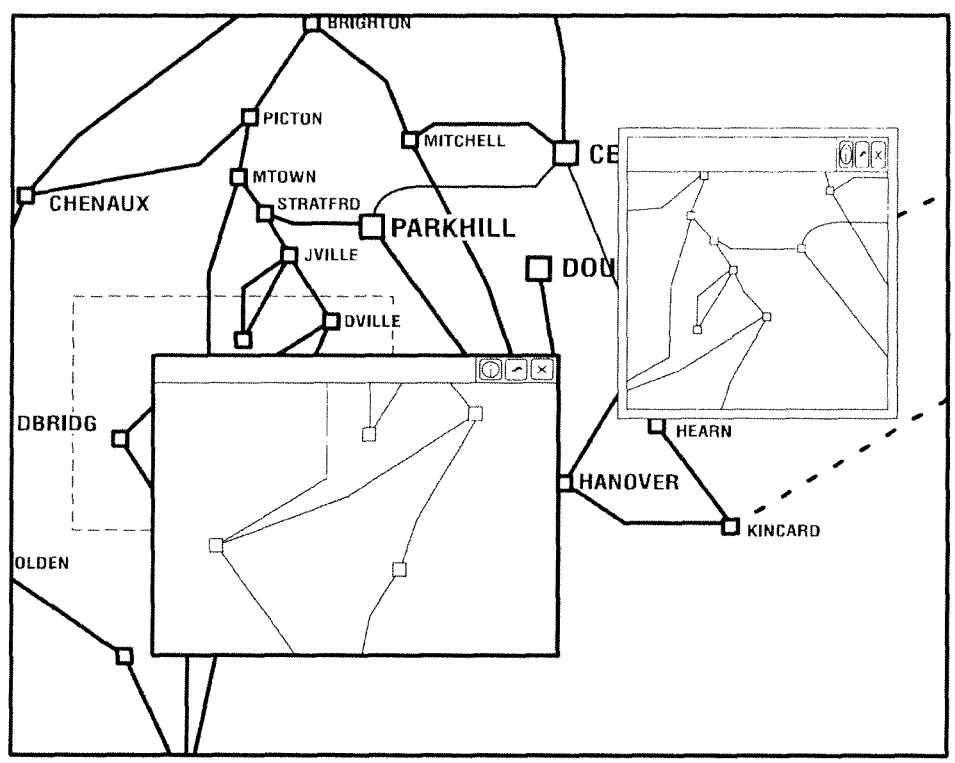
FIG. 6 illustrates one embodiment of a fly-out and a pod of the present invention.

A pod is a fly-out that has been un-pinned from the source display. Pods can be organized as additional windows to monitor specific information such as overload condition on a power line or a low voltage condition. FIG. 6 shows an example of a fly-out and a pod. Situation awareness principles can be utilized with the fly-out. The use of a fly-out allows an operator to generate informational displays without ever leaving the main overviews in order to accomplish a goal. This reinforces the goal of providing a use case based application. The operator is provided with only what it needs to the job and nothing else that can distract the operator from the task that the operator has been asked to do.

Figure 7:
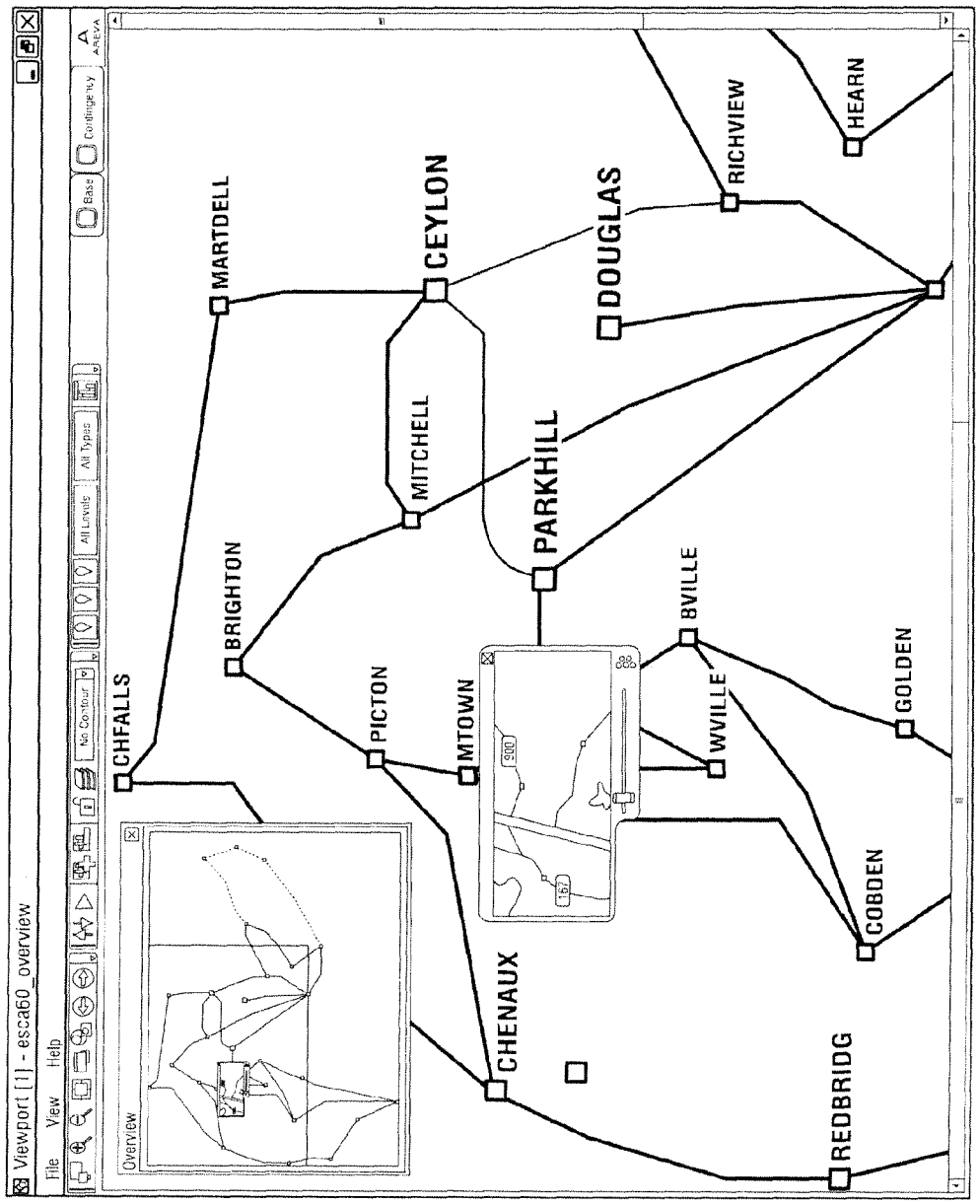
FIG. 7 illustrates one embodiment of a geographical overview with a background layer representing the aerial view of an area of the present invention.

FIG. 7 shows an example of a geographical overview with a background layer representing the aerial view of an area. Other types of operator selected backgrounds, such as jpegs and bitmaps, can be used. In one embodiment, geographic satellites are used to obtain the geographical overview. The operator can then pan and zoom, with different tiles coming up on the display.

Depending on the portion of the overview which is visible and the zoom level, the corresponding tile for the matching background is obtained from the site. Once it is obtained it is locally cached for performance improvement and displayed as the background layer. As the operator pans and the zooms the display new tiles are retrieved and displayed. For efficiency only, the required tiles are loaded into memory and visible in the background.

For optimal visibility depending on the display and control room lighting, the operator can adjust the opacity of the background image using a dialog which is available for invocation from an icon on the toolbar.

FIG. 7 also shows a navigation window and a magnifier in use.

Figure 8:
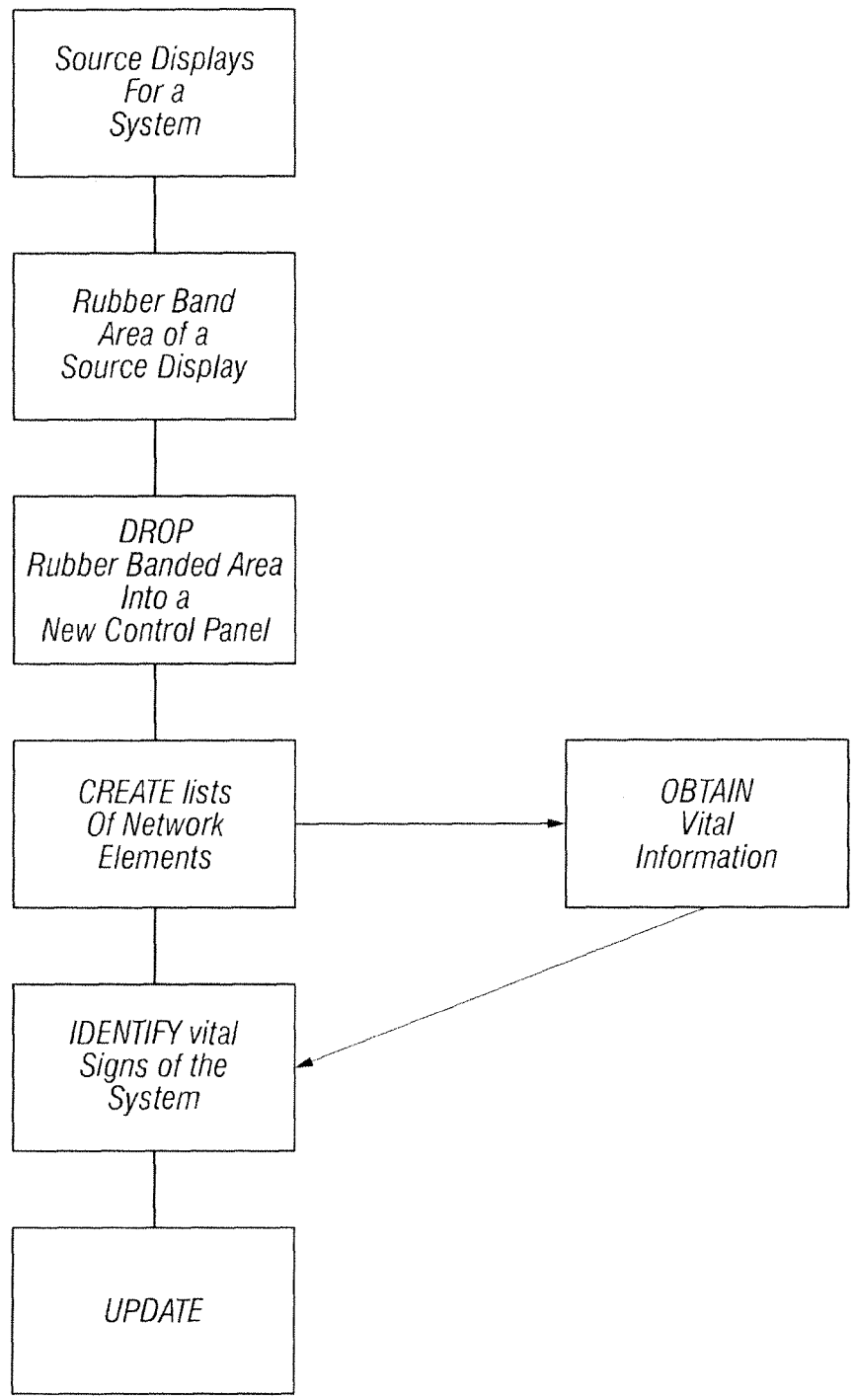
FIG. 8 is a flow chart illustrating one embodiment of a method of the present invention that creates dynamic lists from selected areas of a power system of a utility company using rubber-banding or lassoing.

In another embodiment of the present invention, illustrated in FIG. 8, a method is provided for creating dynamic lists from selected areas of the power system of the utility company. The energy management system is used to access one or more source displays of a site. One or more of the source displays are then rubber-banded or lassoed to create the selected areas from at least a portion of the source displays. Lists, which can be in tabular form, are dynamically created that display operator defined information for each network element type in a list of network elements from the selected areas that have been rubber-banded or lassoed. By way of illustration, and without limitation, the network elements can include one or more of, substations, lines, generators, capacitors, loads, transformers, Static Var Compensators and Inductors, and the like. These lists are dynamically created for an operator selected area of the power system to quickly obtain vital signs for the system within the selected area.

In this embodiment, the operator selects an area by rubber-banding or lassoing an area on the display using a device such as a mouse. All the network elements in the selected area of interest are identified.

The selected area is dragged into a new control panel tab and dropped into the tab. The action of "drag and drop" constitutes the creation of a new list of elements the operator wants to obtain vital information for vital signs. The new list of elements is created by identifying network elements within a perimeter of the selected area. As a non-limiting example, the network elements can be each station and each line within the boundary of the selected area.

The information, which makes up the vital signs, is operator definable. As a non-limiting example, the vital information can be one or more of, the state of the line, energization status of the lines, MegaWatt flows, MegaVar flows of the line, station load, station generation in MegaWatt and Mega-Vars and the like. The present invention takes care of retrieving, from the energy management system, the most recent data associated with this selection, and automatically keeps it up to date. Once the new list is created it can be saved and recalled for future use.

Figure 9:
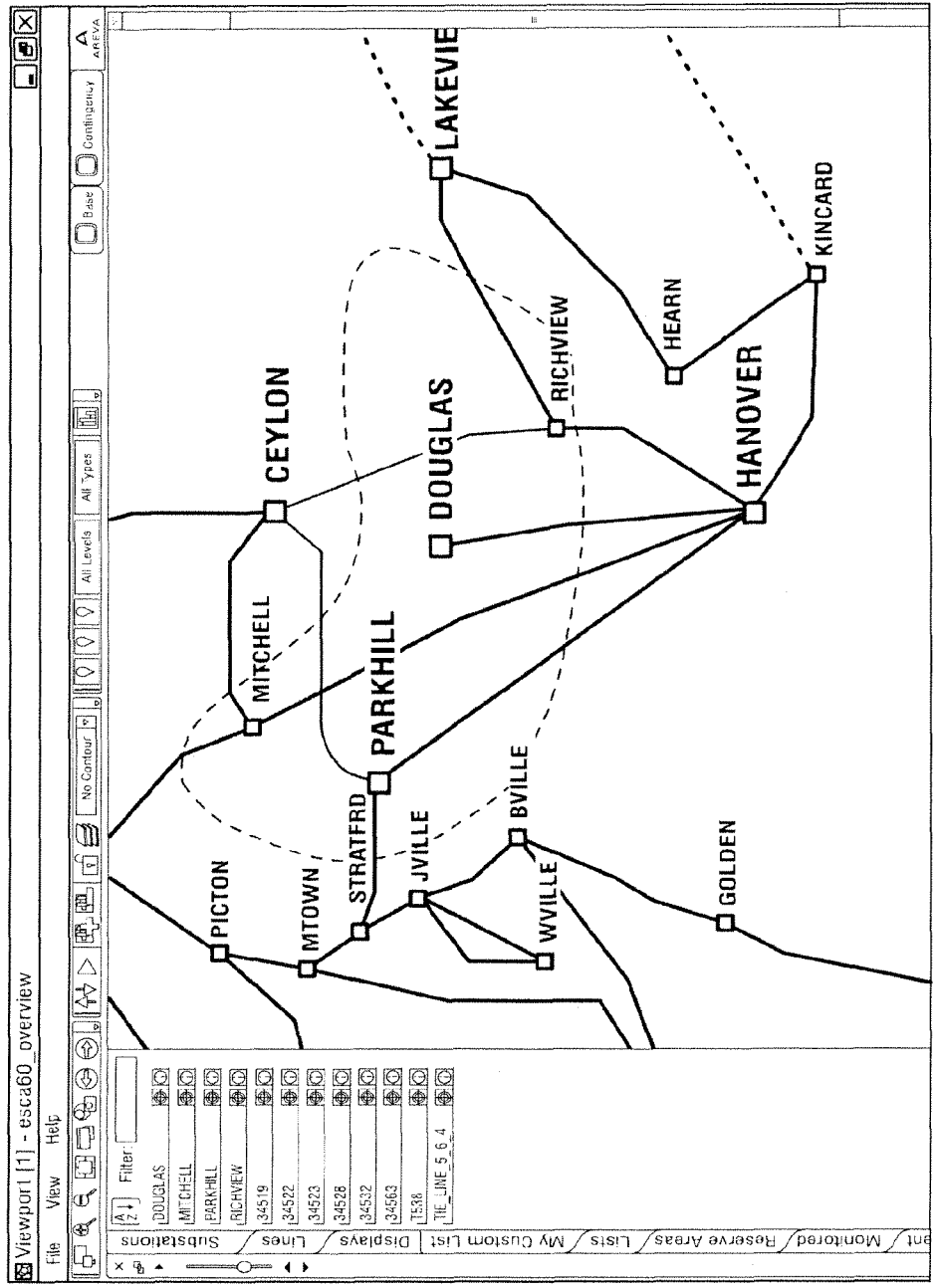
FIG. 9 illustrates one embodiment of area selection that can be used with the flow chart of FIG. 8.
Figures 10, 12:
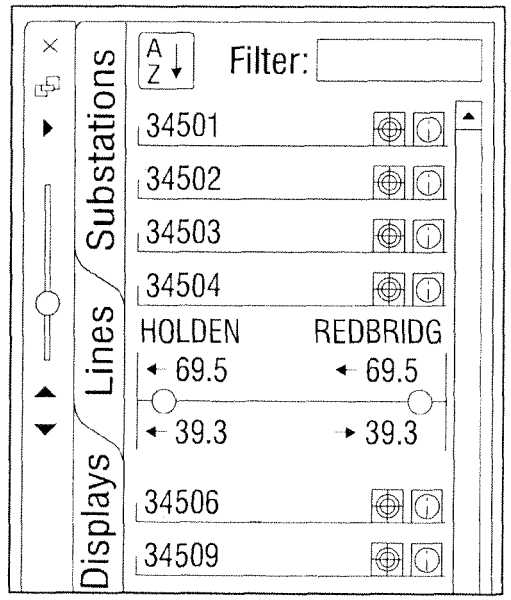
FIG. 10 illustrates one embodiment of vital signs for a selected element that can be utilized with the flow chart of FIG. 8.
FIG. 12 illustrates one embodiment of a MVAR Reserve dashboard that is automatically calculated based on the selected area and can be associated with the FIG. 11 flow chart.

An area selection is shown in FIG. 9. Vital signs for a selected element are shown in FIG. 10.

In one embodiment, the system of the present invention automatically populates the list and receives vital data for all of the elements in this list. The custom list can be given a name and saved for future use.

The control panel can have a special tab, called "Lists," which contains the names of all the custom-created areas. In one specific embodiment, the control panel has a MVAr Reserve tab that contains names of dynamically created MVar Reserve areas for a selected geographic representation of the power system.

Figure 11:
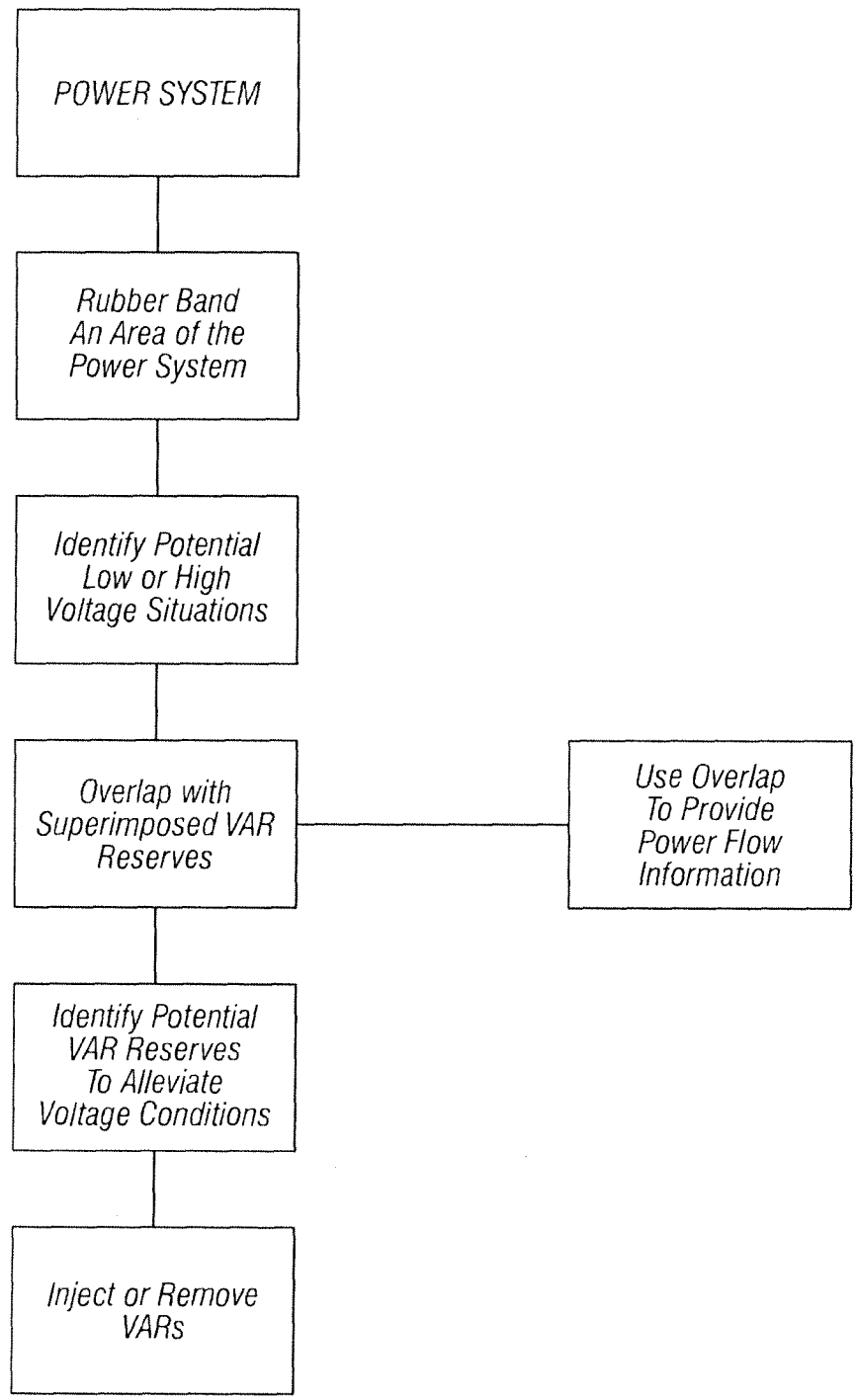
FIG. 11 is a flow chart illustrating one embodiment of a method of the present invention for managing high and low voltage conditions from selected areas of a power system of a utility company.

Referring now to FIG. 11, the present invention also provides an operator with knowledge about where and how much VAR Reserves are available. This is particularly useful for operators facing high or low voltage situations. In a such a situation the operator needs to know if there are sufficient Vars in the area where the low or high voltage condition manifests itself so that they can be injected into or removed from the power system.

In another embodiment of the present invention, a method is provided for managing high or low voltage conditions from selected areas of a power system of a utility company using VAR reserves. Selected geographic are rubber banded or lassoed and potential low or high voltage situations are identified. The control panel can include a context menu. The context menu can be used to show VAR reserves. Once the area is selected, the operator selects the option "Show Reserves" from the context menu to display the MVAR Reserves available within the area. For the selected area, all network elements are identified and a query is generated to obtain the MVAR Reserves associated with the identified network elements. Geographic displays are overlayed with superimposed VAR reserves to create overlayed geographic displays that are used to identify potential low or high voltage instances in the selected geographic areas In one embodiment, voltage contours are used to identify the potential low or high voltage instances. The overlayed geographic displays can be used to provide power flow information of the power system which can be in real time as well as to determine available VAR reserves. The geographic displays can be used to determine if there are sufficient VARS in portions or all of the selected geographic areas where low or high voltage conditions are manifest.

The location and amount of available VAR reserves is determined, and real time information relative to location and amount of available VAR reserves can be provided.

The available VAR reserves can be displayed as a summary for injection into the system and for absorption out of the system by device type, e.g., generation units, capacitor banks, reactor banks, and static Var systems). FIG. 12 shows the MVAR Reserve dashboard, which is automatically calculated based on the selected area. A query can be generated to obtain MVAR reserves associated with the identified network elements.

The injection/absorption reactive reserve is calculated based on the following rules:

Generation Units: Considers only units that are not open or removed. The injection reactive reserve is (MVAR MAX-MVAR Out) and the absorption reactive reserve is (MVAR Out-MVAR Min).

Capacitor Banks: Considers only caps that are not removed from the system. The injection reactive reserve is the summation of nominal MVAR of caps that are open or disconnected. The absorption reactive reserve is the summation of nominal MVAR of caps that are closed.

Reactor Banks: Considers only reactors that are not removed from the system. The injection reactive reserve is the summation of nominal MVAR of caps that are closed. The absorption reactive reserve is the summation of nominal MVAR of caps that are open or disconnected.

Static VAR Systems: Considers only SVS that are not open or removed from the system. The injection reactive reserve is (MVAR MAX-MVAR Out) and the absorption reactive reserve is (MVAR Out-MVAR).

A stacked bar chart provides detailed information about the MVARs availability on a per-station basis and on a per-device-type, associated with the station basis. The height of the bar above the horizontal axis represents the amount of MVARs available to inject into the system from the station. The height of the bar below the horizontal axis represents the amount of MVARs available to absorb (remove) from the system at the station. For each station, the amount of MVARs that can be injected or absorbed is shown below the chart, injected/absorbed.

The chart is sorted from the station with the most available injection to the station with the least available injection. Clicking on the bar will cause the corresponding substation's one-line display to be called into the dashboard area. The operator can therefore rapidly identify which device needs to be operated on, using a familiar SCADA diagram. (Note: No control actions are allowed, the one-lines are read-only displays.)

With the present invention, it is also possible to display a 3D view of the available MVARs using the positive and negative reactive reserves toolbar buttons, as shown in FIG. 13.

The selected area can be saved in the reserves tab in the control panel and recalled for future use. Once recalled the display is automatically restored to the state when it was saved and the MVAR Reserves are updated throughout the system using the most recent real-time values.

Figure 14:
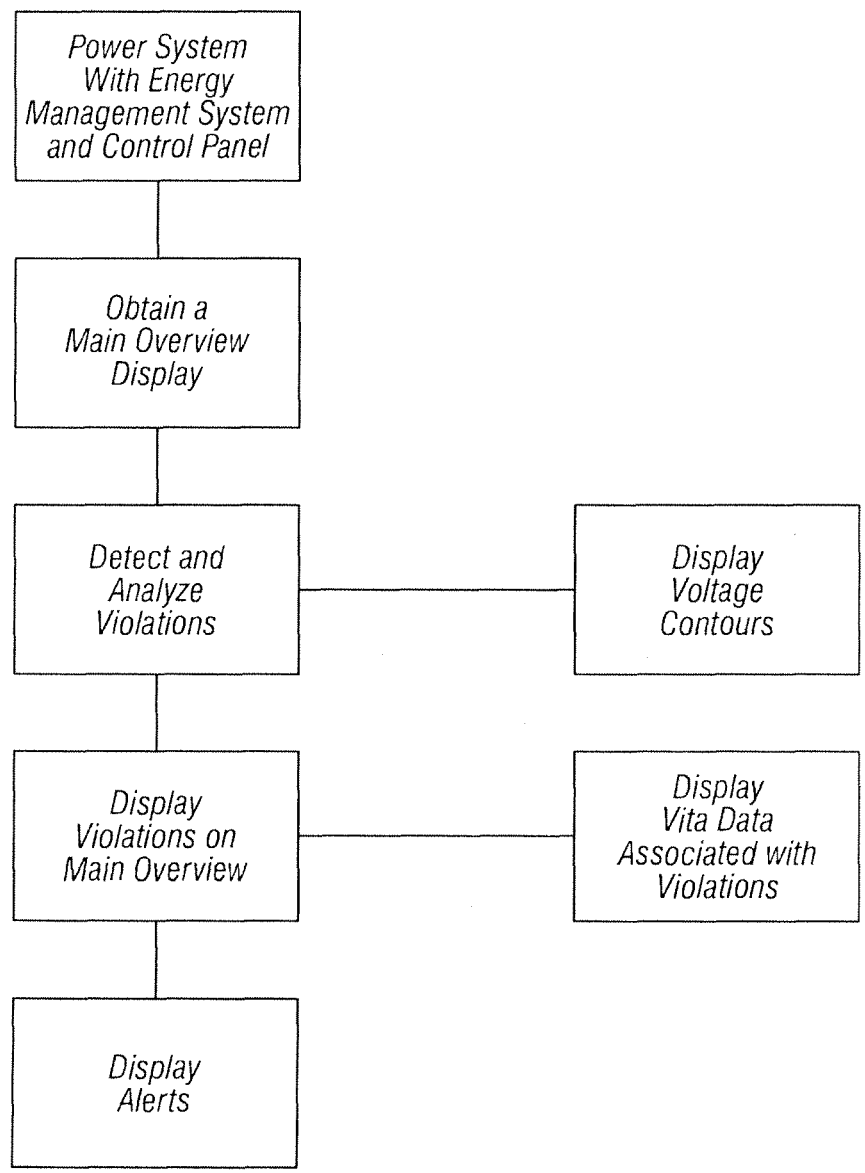
FIG. 14 is a flow chart illustrating one embodiment of a method of the present invention for assessing reliability of a power system of a utility company.
Figure 15:
FIG. 15 is associated with the FIG. 14 flow chart and illustrates that if a new violation appears following the execution of the State Estimator (SE), an alert is displayed of the viewport.

In another embodiment of the present invention, illustrated in FIG. 14, an operator can detect and analyze a base case violation using a Reliability Assessment module. If a new violation appears following the execution of the State Estimator (SE), an alert is displayed of the viewport, as shown in FIG. 15.

If the letters "SE" are visible, the State Estimator has detected one or more new violations. To begin analyzing base case Violations, the operator selects the Base Case Alert button on the Alert Panel. The main Overview display is updated to show violation markers. A voltage contour at the highest KV level for which there are voltage violations is displayed. The Monitored Elements tab is updated with the list of Monitored Elements in the Alarm, Violation, or Warning State. Round Markers are used to represent violations in an overview display. The branch violation marker is presented on the center of the branch. The voltage violation markers and transformer violation markers are presented on the related substation. By way of illustration, and without limitation, examples of markers are shown below:

Red marker, with label "183.2N", representing a branch alarm for a MW value that exceeds the normal limit by 183.2% (v−limit=limit×1.832)

Red marker, with label "0.9N" on white background, representing a voltage alarm for a voltage value that exceeds the normal limit by 0.9% (v−limit=0.09×limit)

Orange marker, with label (Δ41.9E) on white background, representing a voltage drop violation for a voltage drop value that exceeds the emergency limit by 41.9% (v−limit=0.419×limit).

Red marker, with no label and white background, representing multiple violations with different violation types and at least one alarm.

The marker symbol is defined as follows:
Marker Color to represent the Violation severity threshold (warning=yellow, violation=orange, alarm=red).
Marker Fill: White background for voltage violation and/or multiple violations that have different violation types.
Label xxxS: The suffix S represents the limit being referenced ("N" for Normal, "E" for Emergency and "L" for Loadshed) and the number represents the violation percentage over this reference limit. If there is a prefix with Δ, it is a voltage drop violation.

If a new violation is detected relative to the previous run, a halo is presented around the marker. The operator can now drill-down on a particular violation by selecting a violation marker. Only the selected one will appear on the display and all other violation markers will disappear. The same happens in the Monitored Element tab in the control panel, which will only show the violations associated with the current selected marker.

Figure 16:
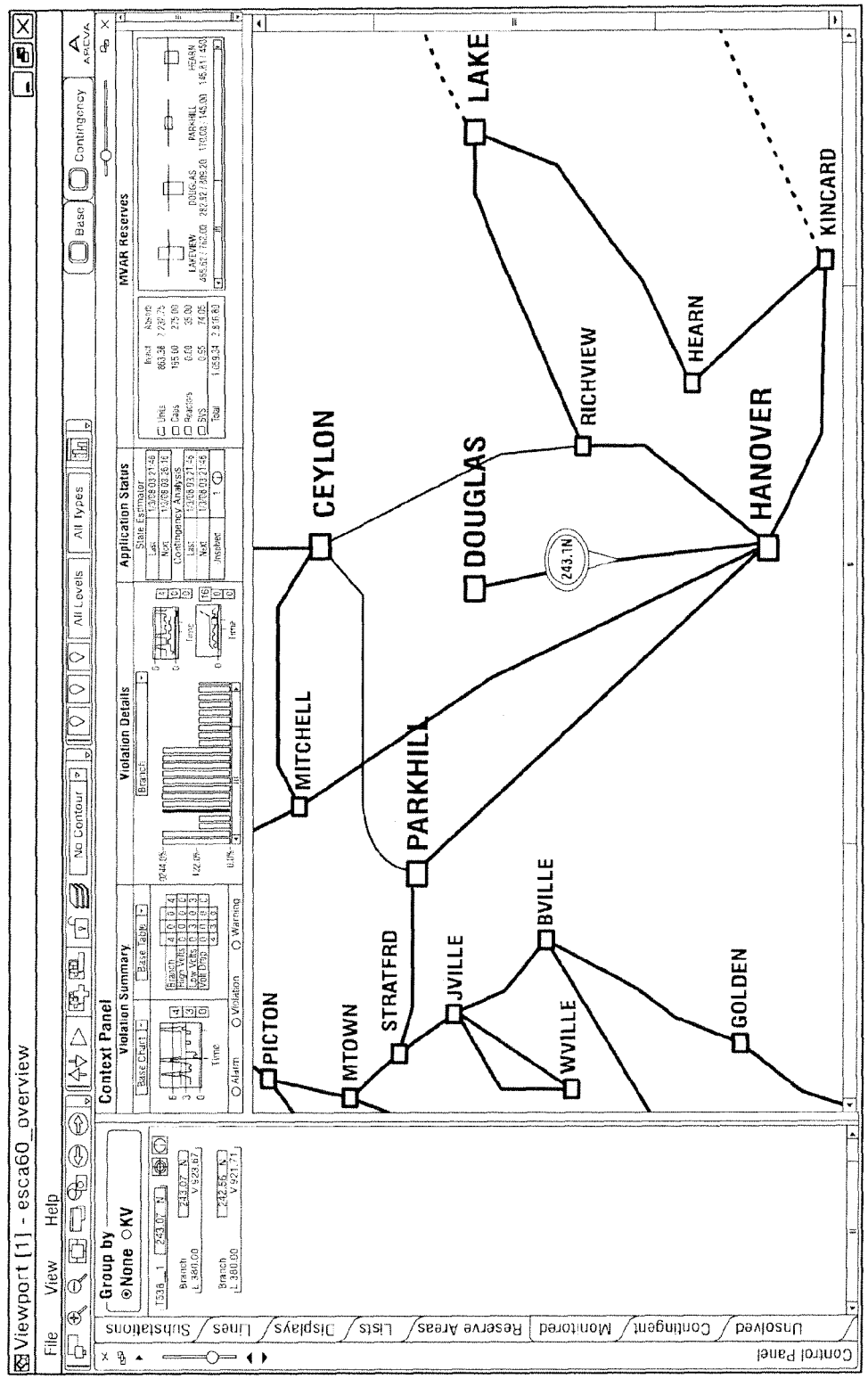
FIG. 16 is associated with the FIG. 14 flow chart and shows a selected branch.

FIG. 16 shows a selected branch Alarm on the branch DOUGLAS-HANOVER. The control panel on the left is automatically open on the list of monitored elements and positioned on this branch. The control panel monitored element list shows the vital data related to all violations selected in the overview display. For each monitored element, the name and the highest percent over the limit value being violated is displayed on the top line.

By way of illustration, and without limitation, details for each violation can include:
The limit value, displayed as "Lxxx.xx"
The current value, displayed as "Vxxx.xx"
The percentage over the limit it violates.
In case of a branch, there might be two entries, one for each end of the branch.

There can be two icons for each Monitored element in violation: one for locating the element on the overview displays and one for calling the associated line display in a dashboard tab to obtain more information.

In one embodiment of the present invention, an operator can detect and analyze a contingency case violation using a Reliability Assessment module. If a new violation appears following the execution of the Contingency Analysis (CA), an alert is displayed on the top right corner as shown in FIG. 15. The operator selects the contingency alert button to begin analyzing Post Contingency Violations. Elements in Alarm, Violation, or Warning States as calculated by CA. The Contingent Tab in the Control Panel is updated with the list of contingencies impacting Monitored Elements in violations.

The material presented on the Overview display is very similar for the base case with the addition of being able to:
display contingency-related information, and
visualize and assess the relationship between monitored elements and contingencies.

Using combinations of the Overview display, the Control Panel, and the Violation toolbar filters, the operator can drill down the Post Contingency Case violations in both a graphical and a list format.

Figure 17:
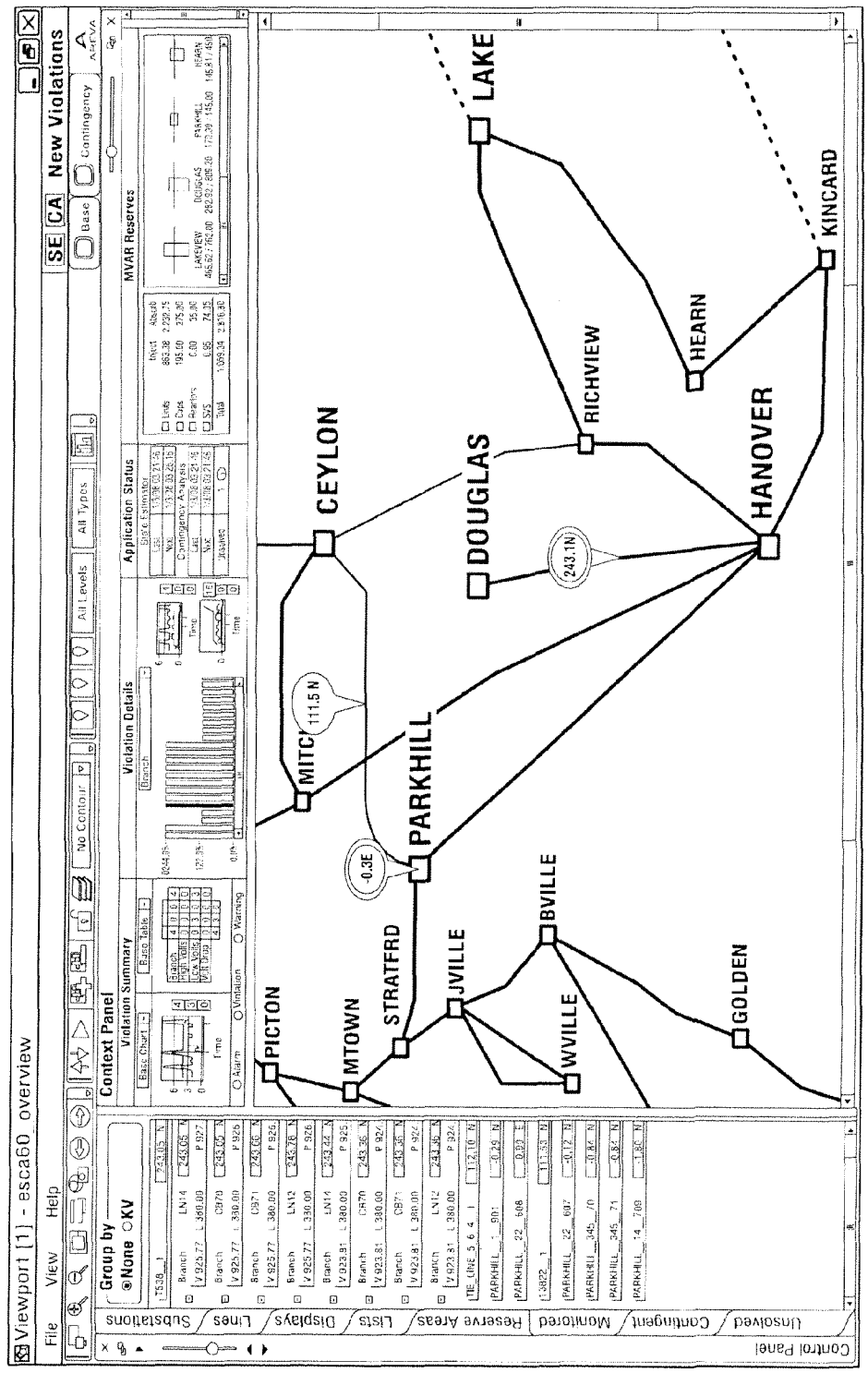
FIG. 17 is associated with the FIG. 14 flow chart and shows how markers associated with the monitored elements in post contingency violations are displayed.

As shown in FIG. 17, markers associated with the monitored elements in post contingency violations are displayed.
The violation markers associated with the monitored elements on the overview display in the post contingency case have the same meaning as the marker in the base case.

Figure 18:
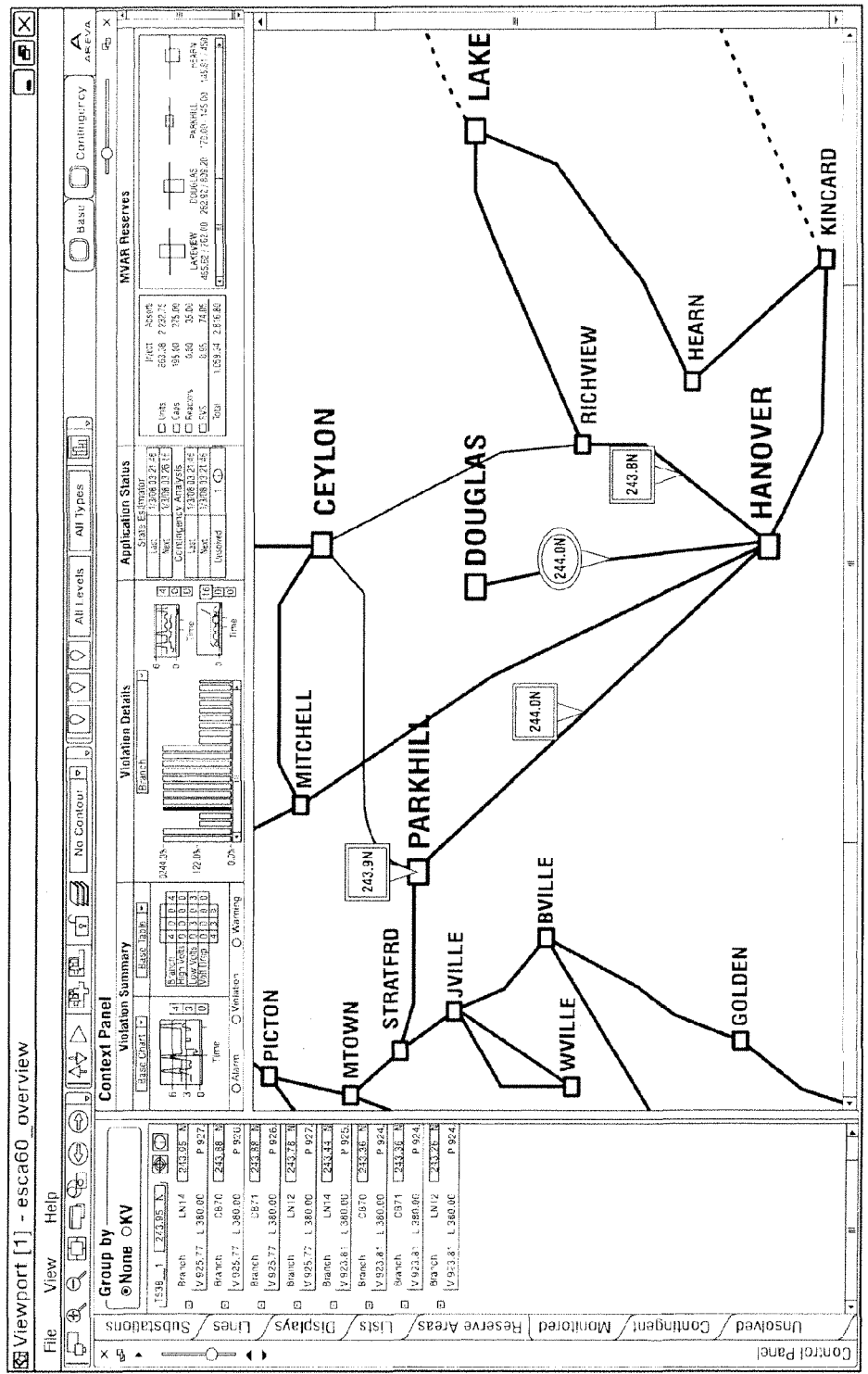
FIG. 18 is associated with the FIG. 14 flow chart and shows that to drill down into a particular violation, the operator can select a violation marker for an Alarm on branch.

To drill down into a particular violation, the operator selects a violation marker, as shown in FIG. 18 below, for the Alarm on branch DOUGLAS-HANOVER.

The control panel shows the element monitored with the following information:
Name of the monitored element;
Type of violation;
Base Case Value (letter "V" in front of the value);
Post Contingency Value (letter "P" in front of the value);
Limit Value associated with the Alarm, Violation, or Warning being presented; and
Percent over the limit (N: Normal, E: Emergency, L: Loadshed).

Figure 19:
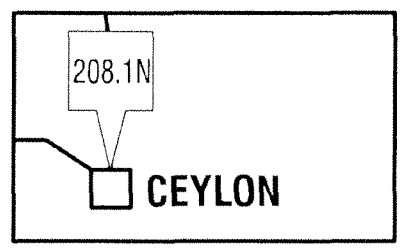
FIG. 19 is associated with the FIG. 14 flow chart and illustrates that when a contingent element creates a violation, a square marker can be provided.

A contingent element is a power system element that represents a defined contingency in the CA application. When this contingent element creates a violation, a square marker, as shown in FIG. 19, appears on the branch or substation. The same principles as for violation markers apply:
As shown, color can be used to represent a violation's severity (worst created by the contingent element in case of multiple violations), as follows:
White background: Voltage violation; and
No background: Branch violation.
Labe describes the worst violation in the same way as on a violation marker.

Figure 20:
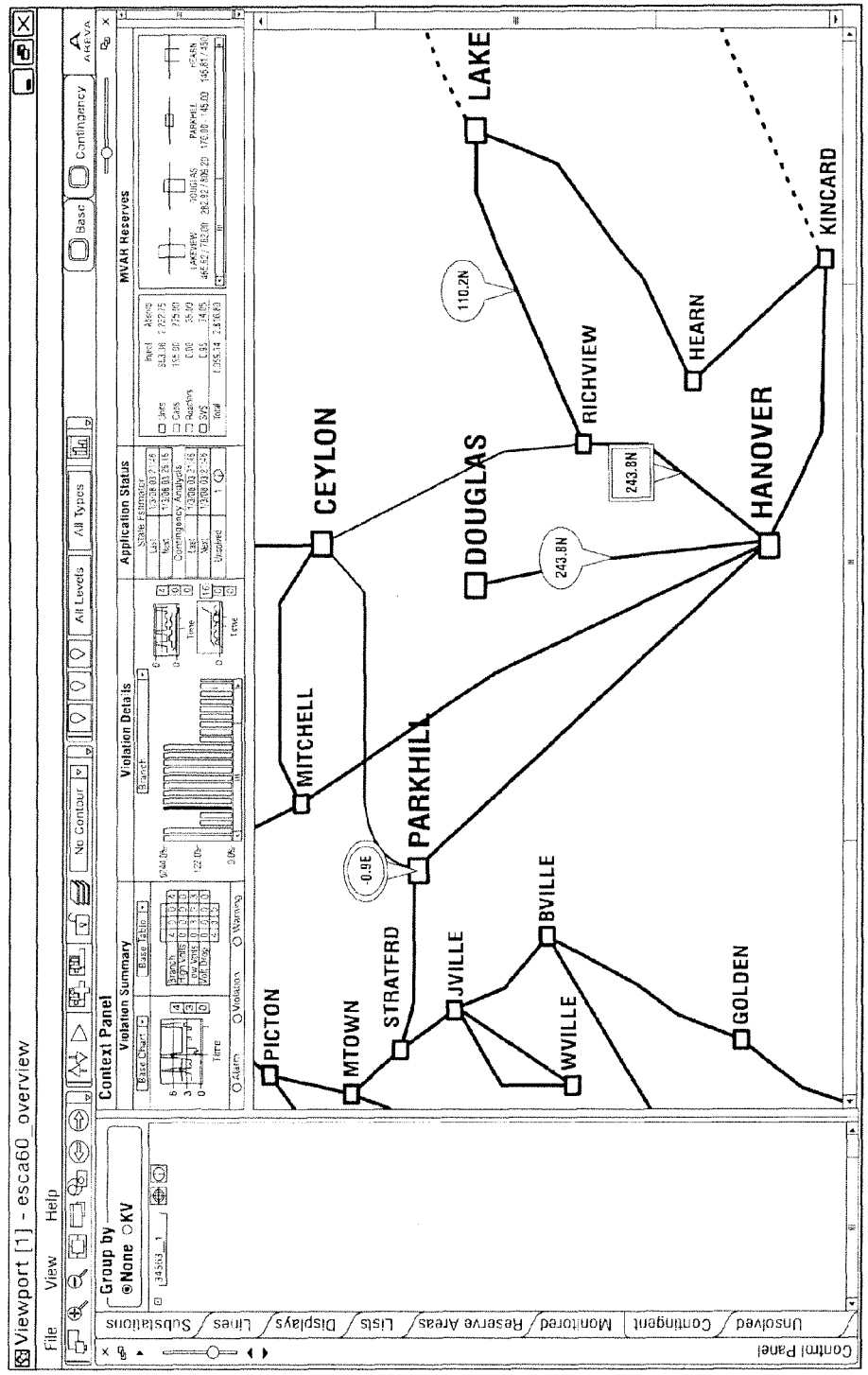
FIG. 20 is associated with the FIG. 14 flow chart and illustrates that selecting a contingent element marker can cause a display all violations that a particular contingent element creates.

As shown in FIG. 20, selecting a contingent element marker will display all violations that this particular contingent element creates. The Contingency tab will be automatically opened and show a list of contingencies that are impacting the monitored elements in Alarm, Violation, or Warning states (refer to the Monitored Elements tab).

Figure 21:
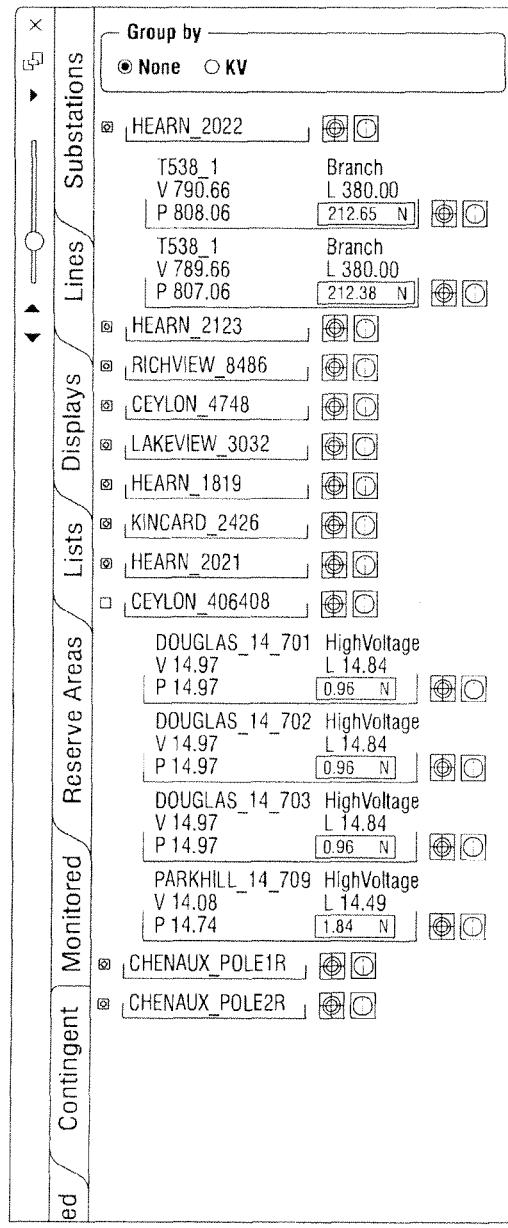
FIG. 21 is associated with the FIG. 14 flow chart and shows a Contingency Tab in a control panel.

FIG. 21 shows the Contingency Tab in the control panel.
In one embodiment, for each contingency in the tab, the name is presented as a tab item. Two icons are next to the name. One icon locates the contingent element(s) on the overview display, and the other icon calls an associated display in a dashboard tab. You can obtain detailed information related to the contingency by expanding the tree (i.e., click on the "+" sign to the left of the name). The expanded contingent item will display a list of monitored elements it impacts. They are sorted using the same criteria as the monitored elements in the Monitored Elements Tab.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method of injecting or removing a unit of reactive power of an alternating current (VAR) from a power system of a utility company, the utility company having an energy management system with a control panel and logic resources, comprising:
using the logic resources to provide a real time situation awareness of a potential failure relative to the utility company that can effect one or more conditions prior to an occurrence of a failure in the power system, the situation awareness being an auditory or visual comprehension in the power system;
accessing one or more source displays of the selected one or more geographic areas;
identifying station or line elements located in an operator selected one or more geographic areas to obtain information relative to station or line elements at the one or more geographic areas;
creating one or more lists of operator defined information relative to the station or line elements that are savable for future use for at least a portion of the station or line elements;
obtaining information relative to the station or line elements in selected one or more geographic areas;
in response to determining an amount of VAR reserves available, generating an overlaid geographic display by overlaying a geographic display with a superimposed VAR reserve;
using the overlayed geographic display to identify potential low or high voltage instances in the selected one or more geographic areas; and
injecting or removing a VAR in or from the selected one or more geographic areas from the power system.

2. The method of claim 1, further comprising:
providing a menu to display VAR reserves available within the selected one or more geographic areas.

3. The method of claim 2, further comprising:
selecting by the operator a show reserves element from the menu to display the VAR reserves available within selected one or more geographic areas.

4. The method of claim 1, further comprising:
for the selected one or more geographic areas generating a query to obtain the VAR reserves associated with selected network elements.

5. The method of claim 1, further comprising:
using voltage contours to identify potential low or high voltage instances.

6. The method of claim 5, wherein the information for vital signs is selected from at least one of, a state of a line, energization status of lines, MegaWatt flows, MegaVAR flows of a line, a station load and a station generation in MegaWatt and MegaVARs.

7. The method of claim 1, further comprising:
using the overlayed geographic displays to provide power flow information of the power system.

8. The method of claim 7, wherein the power flow information of the power system is in real time to determine available VAR reserves.

9. The method of claim 1, wherein available VAR reserves are displayed.

10. The method of claim 9, wherein the available VAR reserves are displayed as a summary for injection into the system and for absorption out of the system by a device type.

11. The method of claim 10, wherein the device type is selected from at least one of, generation units, capacitor banks, reactor banks and a static VAR system.

12. The method of claim 1, further comprising:
providing a VAR reserve dashboard.

13. The method of claim 12, wherein the VAR reserve dashboard is updated based on a value related to the selected one or more geographic areas.

14. The method of claim 13, wherein the update of the VAR reserve dashboard is automatically.

15. The method of claim 1, further comprising:
displaying violations as violation markers.

16. The method of claim 15, further comprising:
drilling down on a particular violation in response to receiving a selection of a violation marker via an operator input device.

17. The method of claim 15, further comprising:
showing only an elected violation marker on a monitored element tab in the control panel and all other violation markers disappear.

18. The method of claim 1, wherein the selected one or more geographic areas are placed in a new control panel tab.

19. The method of claim 18, wherein in response to placing the selected one or more geographic areas in the new control panel tab, a new list of elements is selected by the operator to obtain information for vital signs.

20. The method of claim 19, wherein the new list of elements is created by identifying station or line elements within perimeters of the selected one or more geographic areas.

* * * * *